United States Patent
Chiang et al.

(10) Patent No.: US 11,024,749 B1
(45) Date of Patent: Jun. 1, 2021

(54) DUAL CHANNEL TRANSISTOR DEVICE AND METHODS OF FORMING THE SAME

(71) Applicant: Taiwan Semiconductor Manufacturing Company Limited, Hsinchu (TW)

(72) Inventors: Katherine H. Chiang, New Taipei (TW); Chung-Te Lin, Taiwan (TW)

(73) Assignee: TAIWAN SEMICONDUCTOR MANUFACTURING COMPANY LIMITED, Hsinchu (TW)

(*) Notice: Subject to any disclaimer, the term of this patent is extended or adjusted under 35 U.S.C. 154(b) by 0 days.

(21) Appl. No.: 16/901,057

(22) Filed: Jun. 15, 2020

(51) Int. Cl.
| | |
|---|---|
| H01L 29/78 | (2006.01) |
| H01L 29/788 | (2006.01) |
| H01L 29/423 | (2006.01) |
| H01L 21/28 | (2006.01) |
| G11C 7/10 | (2006.01) |
| H01L 29/66 | (2006.01) |

(52) U.S. Cl.
CPC ........ H01L 29/7889 (2013.01); G11C 7/1069 (2013.01); G11C 7/1096 (2013.01); H01L 29/40114 (2019.08); H01L 29/42324 (2013.01); H01L 29/66825 (2013.01)

(58) Field of Classification Search
None
See application file for complete search history.

(56) References Cited

U.S. PATENT DOCUMENTS

| | | | |
|---|---|---|---|
| 6,844,238 B2* | 1/2005 | Yeo ........................ | H01L 29/785 257/E29.137 |
| 7,947,591 B2* | 5/2011 | Hsu ...................... | H01L 29/4966 438/591 |
| 10,008,614 B1* | 6/2018 | He ..................... | H01L 29/78696 |
| 2011/0127602 A1* | 6/2011 | Mallikarjunaswamy .................... | H01L 29/0649 257/331 |
| 2017/0162570 A1* | 6/2017 | Shih .................. | H01L 29/66545 |

* cited by examiner

*Primary Examiner* — Tan T. Nguyen
(74) *Attorney, Agent, or Firm* — The Marbury Law Group, PLLC

(57) ABSTRACT

A semiconductor device includes a source region and a drain region laterally spaced from each other and overlying a substrate, a metal oxide semiconductor channel layer overlying, and contacting, the source region and the drain region, a first gate dielectric layer overlying a portion of the metal oxide semiconductor channel layer, a first gate electrode overlying the first gate dielectric layer and contacting a portion of the metal oxide semiconductor channel layer, a second gate dielectric layer contacting a sidewall of the metal oxide semiconductor channel layer, and a second gate electrode contacting a sidewall of the second gate dielectric layer and spaced from the metal oxide semiconductor channel layer by the second gate dielectric layer. The first gate electrode may be a floating gate that stores electrical charges, and turns on or off a first transistor including the source region and the drain region.

20 Claims, 15 Drawing Sheets

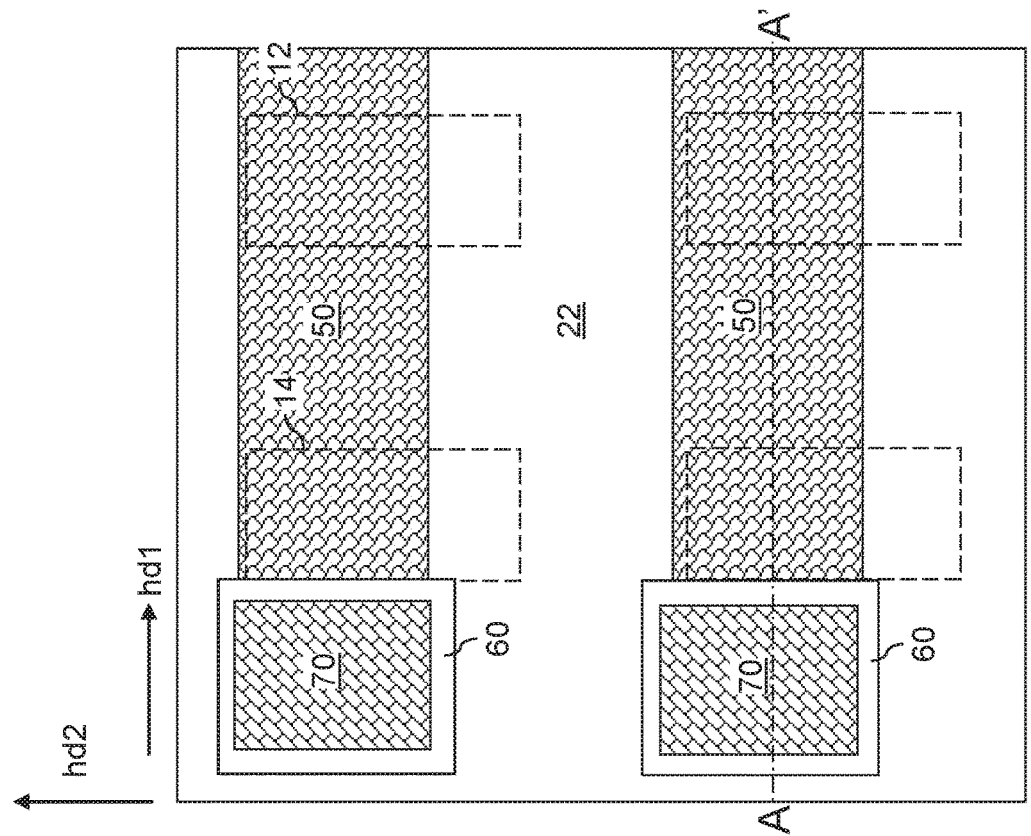
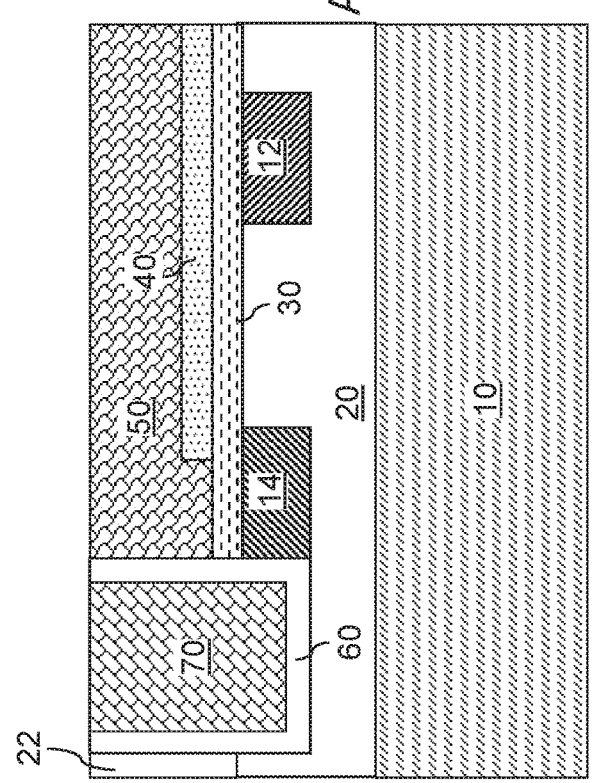
FIG. 7A
FIG. 7B

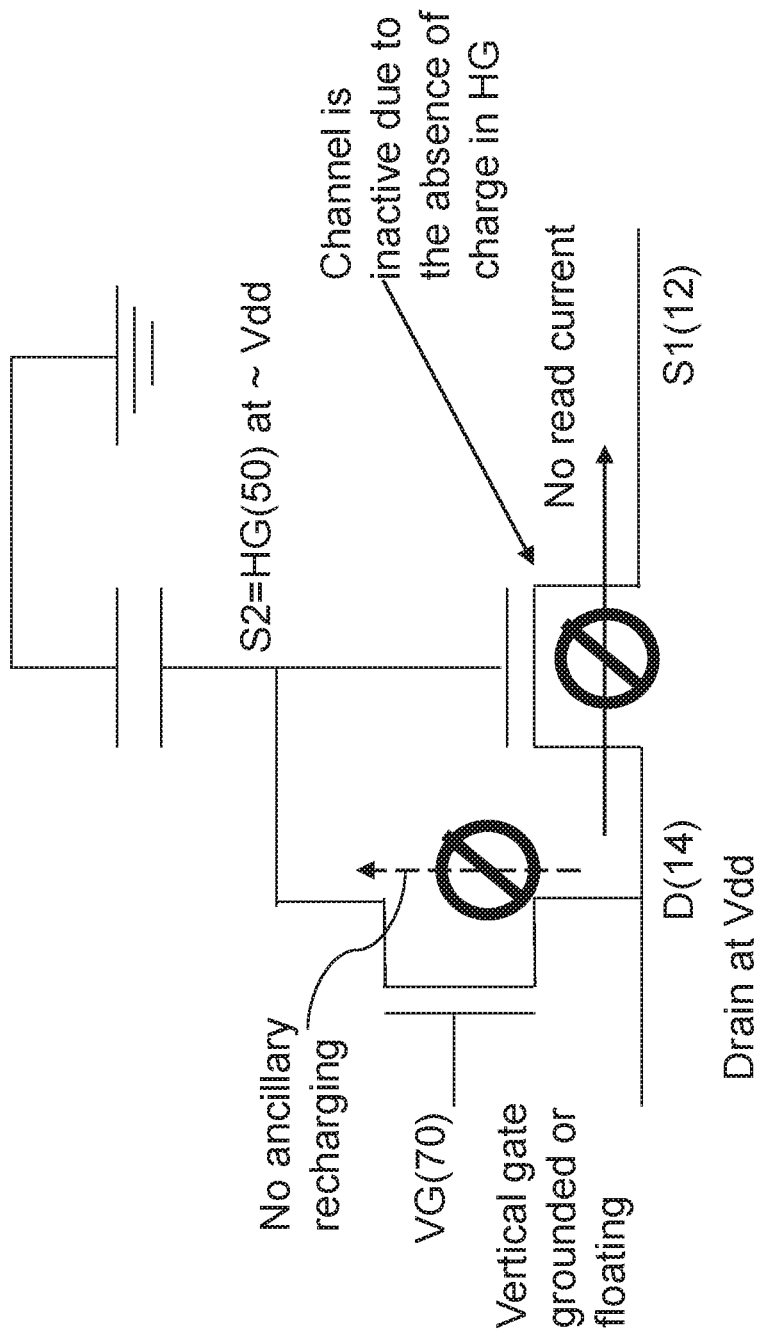

DUAL CHANNEL TRANSISTOR DEVICE AND METHODS OF FORMING THE SAME

BACKGROUND

Memory devices that use stored electrical charges include volatile dynamic random access memory devices. Such volatile dynamic random access memory devices require periodic refreshing of the stored electrical charges. Other memory devices might include nonvolatile flash memory devices that use charge tunneling. While flash memory devices may be advantageous as they are nonvolatile devices, the flash memory devices are prone to device performance degradation over time after repeated usage due to cumulative damages that occur to the tunneling dielectric. In light of these disadvantages, a nonvolatile memory device that may provide longer endurance than flash memory devices is thus desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A is a vertical cross-sectional view of the exemplary structure after formation of a second gate dielectric layer and a second gate electrode in each via cavity according to an embodiment of the present disclosure.

FIG. 7B is a top-down view of the exemplary structure of FIG. 7A. The vertical plane A-A' is the plane of the vertical cross-section of FIG. 7A.

FIG. 9B schematically illustrates the configuration of the dual channel transistor device of the present disclosure during a read operation in embodiments in which electrical charges are not stored in the first gate electrode according to an embodiment of the present disclosure.

DETAILED DESCRIPTION

Figure 1B:
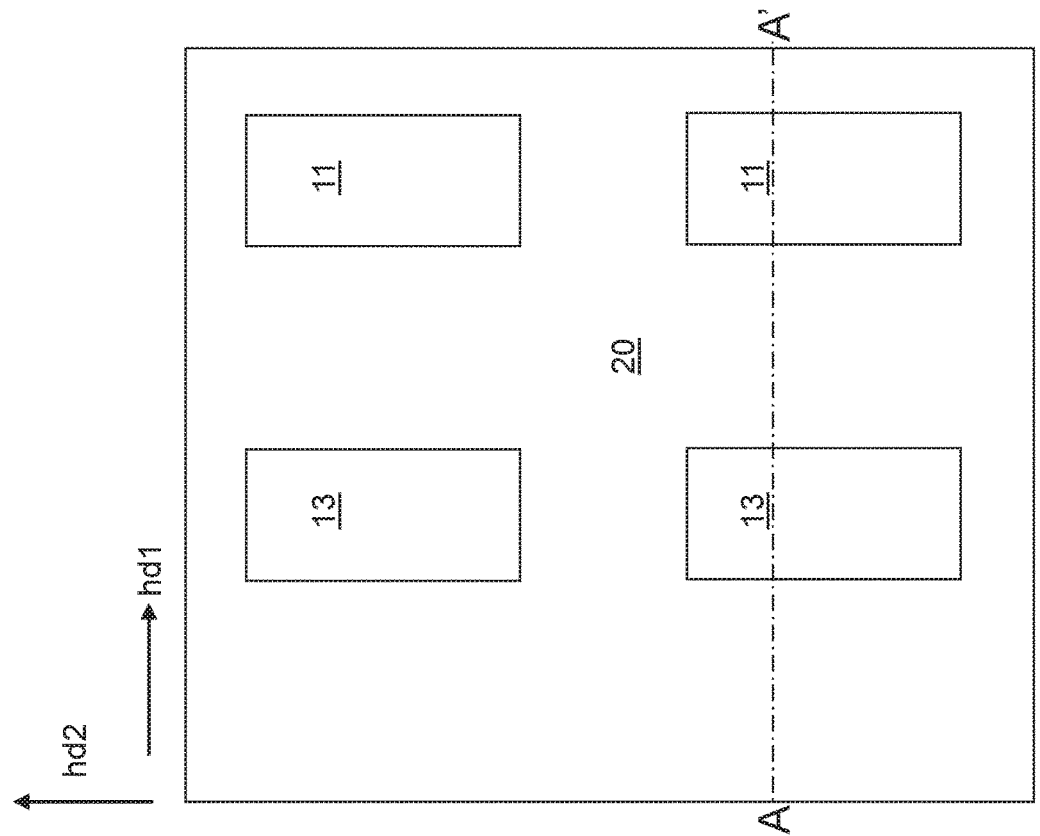
FIG. 1B is a top-down view of the exemplary structure of FIG. 1A. The vertical plane A-A' is the plane of the vertical cross-section of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed generally to semiconductor devices, and specifically to a memory device using two gate electrodes and two current flow paths, methods of manufacturing the same, and methods of operating the same According to an embodiment of the present disclosure, a metal oxide semiconductor channel layer is used to provide a horizontal electrical current path and a vertical electrical current path. The horizontal electrical path may be between a source region and a drain region, and may be controlled by a first gate electrode which is a floating gate electrode that may store electrical charges. Charging or discharging the electrical charges in the first gate electrode may be effected by a combination of a second gate dielectric layer and a second gate electrode that may be provided on a sidewall of the metal oxide semiconductor channel layer. The memory device of various embodiments of the present disclosure includes a dual channel transistor device that may store electrical charges in the first gate electrode without charge tunneling. The two channel directions may be orthogonal to one another, and thus, the memory device of the various embodiment of the present disclosure is also referred to as an orthogonal channel transistor device.

Figure 1A:
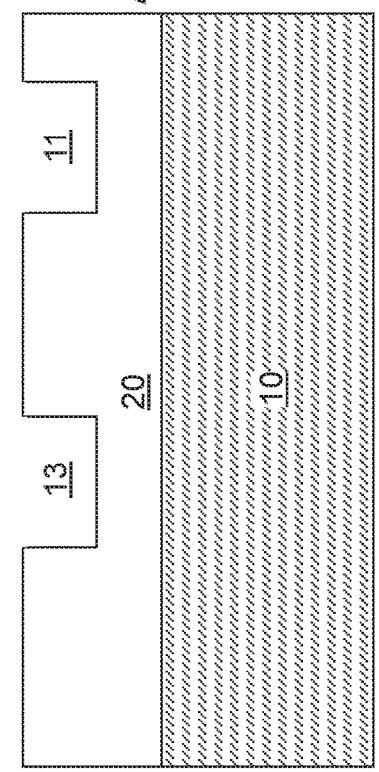
FIG. 1A is a vertical cross-sectional view of an exemplary structure after formation of source recess regions and drain recess regions in an insulating matrix layer according to an embodiment of the present disclosure.

Referring to FIGS. 1A and 1B, an exemplary structure according to an embodiment of the present disclosure is illustrated. FIG. 1A is a vertical cross-sectional view of an exemplary structure after formation of source recess regions and drain recess regions in an insulating matrix layer according to an embodiment of the present disclosure. FIG. 1B is a top-down view of the exemplary structure of FIG. 1A. The vertical plane A-A' is the plane of the vertical cross-section of FIG. 1A.

The exemplary structure includes a substrate 10, which may be a semiconductor substrate (such as a semiconductor wafer), an insulating substrate, a conductive substrate, or a hybrid substrate including multiple material layers. An insulating matrix layer 20 may be formed on a top surface of the substrate 10, or may be provided as a top portion of the substrate 10. Alternatively, in embodiments in which the substrate 10 comprises an insulating substrate, the insulating matrix layer 20 may be an upper portion of the insulating substrate. In an illustrative example, the insulating matrix layer 20 may be deposited using a conformal or non-conformal deposition method. For example, the insulating matrix layer 20 may include a silicon oxide material (such as undoped silicate glass or a doped silicate glass). The insulating matrix layer 20 may have a thickness in a range from 100 nm to 2,000 nm, although lesser and greater thicknesses may also be used. Alternative materials that may be used for the insulating matrix layer 20 include, but are not limited to, quartz, silicon carbide nitride, and aluminum oxide. Other suitable materials are within the contemplated scope of disclosure. In embodiments in which the substrate 10 includes a semiconductor substrate (such as a silicon substrate), semiconductor devices (not shown) such as field effect transistors may be formed on the substrate 10. In such embodiments, the insulating matrix layer 20 may have metal interconnect structures (not shown) formed therein.

A photoresist layer (not shown) may be applied over the top surface of the insulating matrix layer 20, and may be lithographically patterned to form discrete openings therethrough. At least one pair of openings may be patterned in the photoresist layer. An anisotropic etch process may be performed to transfer the pattern in the photoresist layer through an upper portion of the insulating matrix layer 20. Recess regions (11, 13) may be formed in volumes of the insulating matrix layer 20 that are removed by the anisotropic etch process. Alternatively, an isotropic etch process may be used to pattern the recess regions (11, 13) in the insulating matrix layer 20. The photoresist layer may be subsequently removed, for example, by ashing.

The recess regions (11, 13) include source recess regions 11 in which source regions may be subsequently formed, and include drain recess regions 13 in which drain regions are subsequently formed. A pair of a source recess region 11 and a drain recess region 13 may be laterally spaced apart along a first horizontal direction hd1. A plurality of pairs of a source recess region 11 and a drain recess region 13 may be formed, and may be arranged along a second horizontal direction hd2 that is perpendicular to the first horizontal direction hd1.

Each of the recess regions (11, 13) may have a depth in a range from 10 nm to 200 nm, although lesser and greater depths may also be used. A pair of a source recess region 11 and a drain recess region 13 that are laterally spaced apart from each other along the first horizontal direction hd1 may have edges that are parallel to the second horizontal direction hd2. In such an embodiment, the pair of source recess region 11 and the drain recess region 13 may have a uniform lateral separation distance, which is the effective channel length of a metal oxide semiconductor channel to be subsequently formed. The lateral spacing between a pair of a source recess region 11 and a drain recess region 13 may be in a range from 10 nm to 200 nm, such as from 20 nm to 100 nm, although lesser and greater lateral spacings (which are channel lengths) may also be used. In one embodiment, the recess regions (11, 13) may have a rectangular horizontal cross-sectional shape, although other cross-sectional shapes are within the contemplated scope of disclosure. The lateral dimension of each recess region (11, 13) along the first horizontal direction hd1 may be in a range from 30 nm to 600 nm, although lesser and greater dimensions may also be used. The lateral dimension of each recess region (11, 13) along the second horizontal direction hd2 may be in a range from 30 nm to 600 nm, although lesser and greater dimensions may also be used.

Figure 2B:
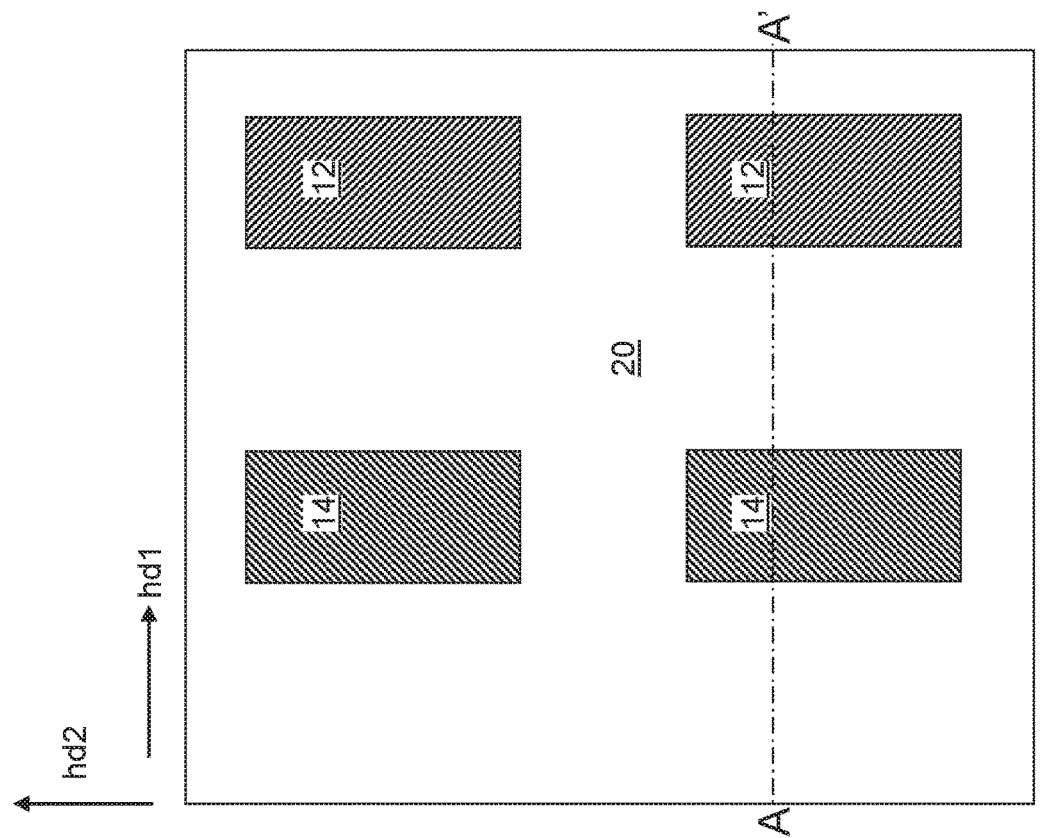
FIG. 2B is a top-down view of the exemplary structure of FIG. 2A. The vertical plane A-A' is the plane of the vertical cross-section of FIG. 2A.
Figure 2A:
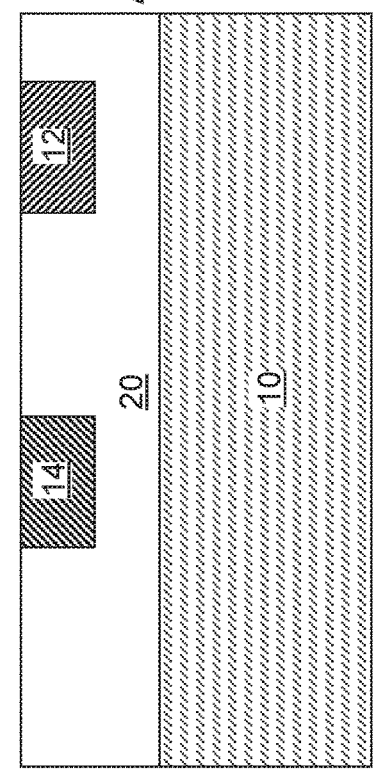
FIG. 2A is a vertical cross-sectional view of the exemplary structure after formation of source regions and drain regions according to an embodiment of the present disclosure.

FIG. 2A is a vertical cross-sectional view of the exemplary structure after formation of source regions and drain regions according to an embodiment of the present disclosure. FIG. 2B is a top-down view of the exemplary structure of FIG. 2A. The vertical plane A-A' is the plane of the vertical cross-section of FIG. 2A. Referring to FIGS. 2A and 2B, a source/drain material may be deposited in the recess regions (11, 13) by a conformal or non-conformal deposition process. The source/drain material is a material that may be used as the material for source regions and drain regions. The source/drain material may include a doped semiconductor material or a metallic material. Exemplary doped semiconductor materials that may be used as the source/drain material include, but are not limited to, doped polysilicon, a doped silicon-germanium alloy, a doped III-V compound semiconductor material such as GaAs, InAs, or InGaAs, and a heavily doped metal oxide semiconductor material such as indium gallium zinc oxide (IGZO), doped zinc oxide, doped indium oxide, or doped cadmium oxide with a high level of doping. Other suitable materials are within the contemplated scope of disclosure. For example, the dopant concentration in the doped semiconductor materials may be in a range from $1.0\times10^{19}/cm^3$ to $2.0\times10^{21}/cm^3$, although lesser and greater dopant concentrations may also be used. The dopant may be p-type or n-type. Exemplary conductive materials that may be used as the source/drain material include conductive metallic nitride materials such as TiN, TaN, and/or WN. Other suitable materials are within the contemplated scope of disclosure.

Excess portions of the doped semiconductor material or the metallic material may be removed from above a horizontal plane including the top surface of the insulating matrix layer 20 by a planarization process such as a chemical mechanical planarization (CMP) process. Each remaining portion of the source/drain material filling a source recess region 11 comprises a source region 12. Each remaining portion of the source/drain material filling a drain recess region 13 comprises a drain region 14. In one embodiment, top surfaces of the source regions 12 and the drain regions 14 may be coplanar with the top surface of the insulating matrix layer 20.

Figure 3A:
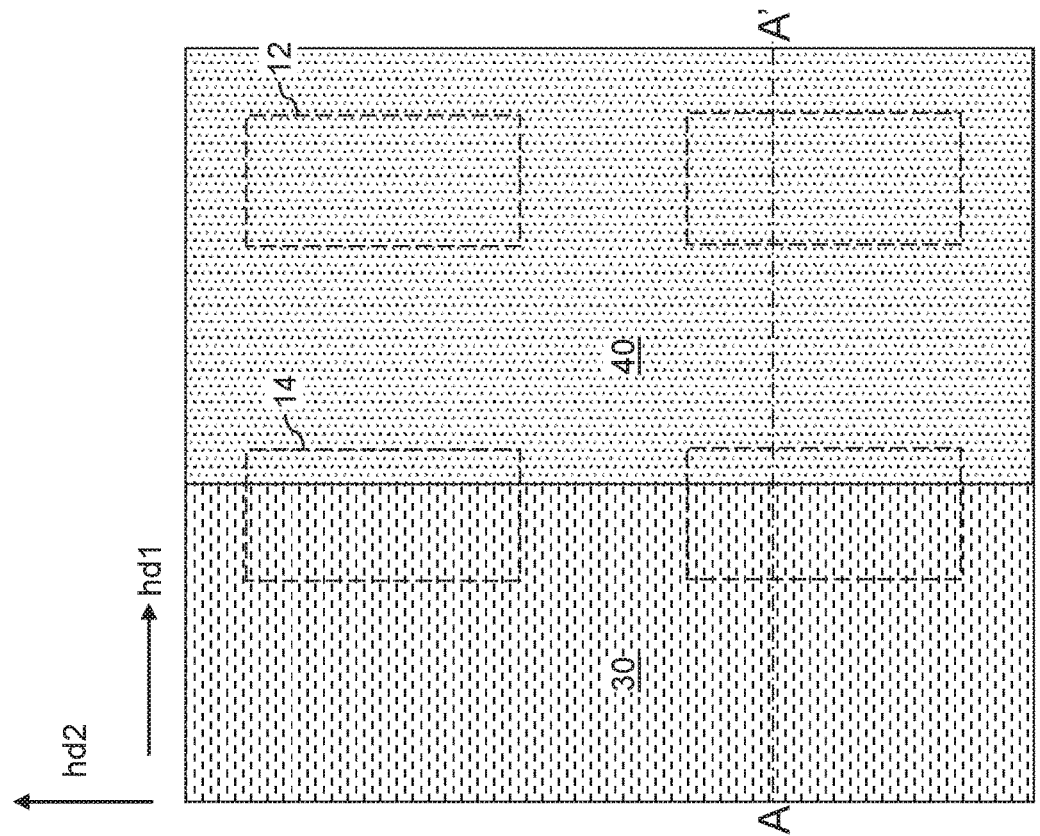
FIG. 3A is a vertical cross-sectional view of the exemplary structure after formation of a metal oxide semiconductor channel layer and a first gate dielectric layer according to an embodiment of the present disclosure.
Figure 3B:
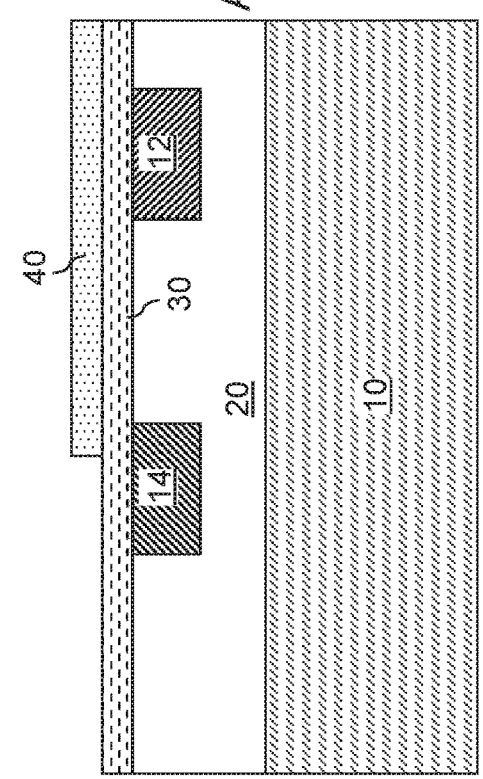
FIG. 3B is a top-down view of the exemplary structure of FIG. 3A. The vertical plane A-A' is the plane of the vertical cross-section of FIG. 3A.

FIG. 3A is a vertical cross-sectional view of the exemplary structure after formation of a metal oxide semiconductor channel layer and a first gate dielectric layer according to an embodiment of the present disclosure. FIG. 3B is a top-down view of the exemplary structure of FIG. 3A. Referring to FIGS. 3A and 3B, a metal oxide semiconductor channel layer 30 may be deposited over the source regions 12, the drain regions 14, and the insulating matrix layer 20. The vertical plane A-A' is the plane of the vertical cross-section of FIG. 3A. The metal oxide semiconductor channel layer 30 includes a metal oxide semiconductor material such as indium gallium zinc oxide (IGZO), doped zinc oxide, doped indium oxide, or doped cadmium oxide. Other suitable materials are within the contemplated scope of disclosure. The dopant level in the metal oxide semiconductor channel layer 30 may be selected such that leakage current through the metal oxide semiconductor channel layer 30 during device operation is negligible. For example, the dopant level in the metal oxide semiconductor channel layer 30 may be in a range from $1.0\times10^{10}/cm^3$ to $2.0\times10^{16}/cm^3$, although lesser and greater dopant concentrations may also be used.

The metal oxide semiconductor channel layer 30 may have a uniform thickness throughout. The thickness of the metal oxide semiconductor channel layer 30 may be in a range from 2 nm to 60 nm, such as from 4 nm to 20 nm, although lesser and greater thicknesses may also be used. The metal oxide semiconductor channel layer 30 may be deposited, for example, by chemical vapor deposition.

Use of a metal oxide semiconductor material instead of an elemental semiconductor material or a III-V compound semiconductor material in the metal oxide semiconductor channel layer 30 provides the advantage of suppressing leakage current to negligible levels, thereby enabling a non-volatile memory device. Metal oxide semiconductor materials may provide an on-off ratio greater than $1.0\times10^9$. In other words, the ratio of the on-current to off-current may be greater than $1.0\times10^9$ for a field effect transistor using a metal oxide semiconductor material as a channel material. In contrast, channels composed of elemental semiconductor materials and III-V compound semiconductor materials provide an on-off ratio of about $1.0\times10^4$. Thus, use of a metal oxide semiconductor material as a channel material provides the benefit of low leakage current. The low leakage current property may provide a non-volatile memory device. If the charge retention time is greater than 1 day or 365 days, the memory device of the present disclosure may function as a non-volatile memory device. Optionally, the memory device to be subsequently formed may be operated with periodic refreshing in the same manner as dynamic random access memories. For example, if the charge retention time is less than 1 day, the memory device of the present disclosure may be operated with a periodic memory refresh operation, in which a data bit is read and re-written on a periodic basis.

Subsequently, a first gate dielectric layer 40 may be deposited over the metal oxide semiconductor channel layer 30. The first gate dielectric layer 40 includes a gate dielectric material such as silicon oxide, silicon oxynitride, a dielectric metal oxide, or a combination thereof. Other suitable materials are within the contemplated scope of disclosure. The thickness of the first gate dielectric layer 40 may be in a range from 1 nm to 12 nm, such as from 2 nm to 6 nm, although lesser and greater thicknesses may also be used. The first gate dielectric layer 40 may be deposited by a conformal deposition process or a non-conformal deposition process.

According to an embodiment of the present disclosure, the first gate dielectric layer 40 may be patterned, for example, by application and patterning of a photoresist layer, and by etching unmasked portions of the first gate dielectric layer 40 that are not masked by the patterned photoresist layer. The photoresist layer may be subsequently removed, for example, by ashing. A remaining portion of the first gate dielectric layer 40 continuously extends over the entirety of the area of a source region 12, the entirety of the area located between the source region 12 and an adjacent drain region 14, and a proximal portion of the adjacent drain region 14, i.e., a portion that is proximal to the source region 12. A distal portion of the adjacent drain region 14 may not be covered by the first gate dielectric layer 40. In one embodiment, the first gate dielectric layer 40 may be patterned such that a straight edge of the first gate dielectric layer 40 that laterally extends along the second horizontal direction hd2 overlies each drain region 14. Thus, a proximal portion of each drain region 14 may be covered with the first gate dielectric layer 40, and a distal portion of each drain region 14 may not be covered with the first gate dielectric layer 40. The fraction of the distal portion of each drain region 14 (i.e., the fraction that is not covered by the first gate dielectric layer 40) relative to the total area of the respective drain region 14 may be in a range from 0.2 to 0.8, such as from 0.35 to 0.65, although lesser and greater fractions may also be used. A portion of a top surface of the metal oxide semiconductor channel layer 30 is physically exposed above each distal portion of the drain regions 14.

Figure 4B:
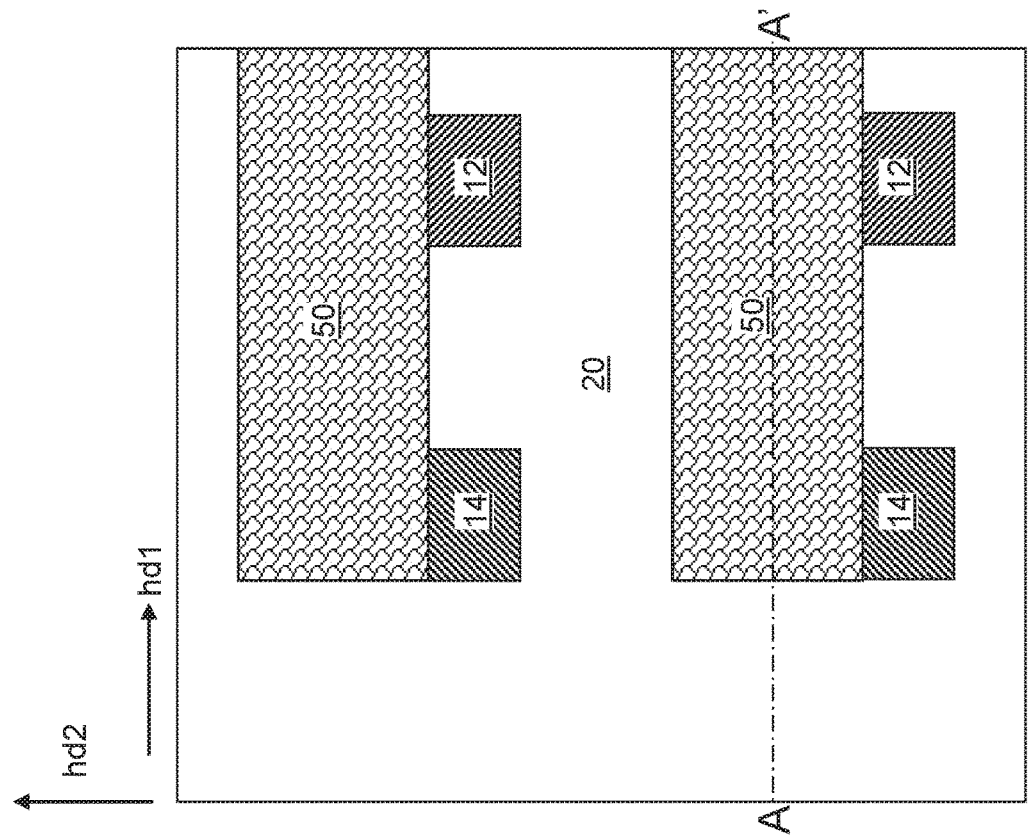
FIG. 4B is a top-down view of the exemplary structure of FIG. 4A. The vertical plane A-A' is the plane of the vertical cross-section of FIG. 4A.
Figure 4A:
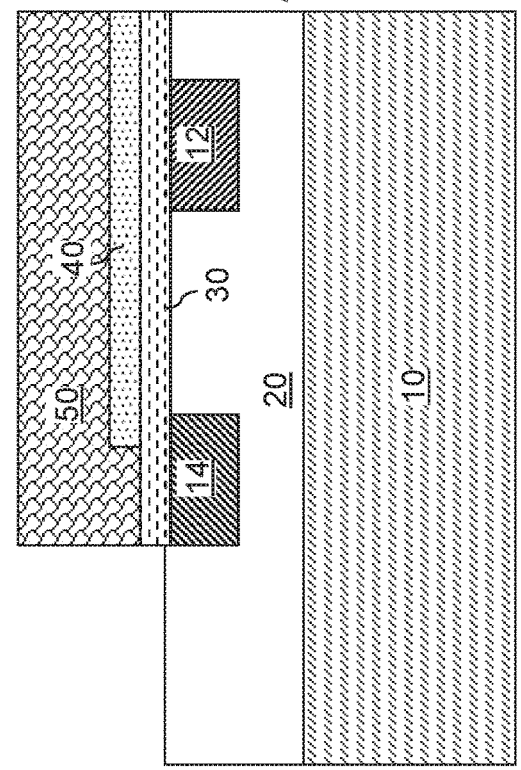
FIG. 4A is a vertical cross-sectional view of the exemplary structure after formation of first gate electrodes according to an embodiment of the present disclosure.

FIG. 4A is a vertical cross-sectional view of the exemplary structure after formation of first gate electrodes according to an embodiment of the present disclosure. FIG. 4B is a top-down view of the exemplary structure of FIG. 4A. Referring to FIGS. 4A and 4B, a gate electrode material may be deposited on the physically exposed surface of the metal oxide semiconductor channel layer 30 and the first gate dielectric layer 40. The vertical plane A-A' is the plane of the vertical cross-section of FIG. 4A. The gate electrode material may include a doped semiconductor material or a metallic material. Doped semiconductor materials that may be used as the gate electrode material include doped polysilicon, a silicon-germanium alloy, or a doped III-V compound semiconductor material. Other suitable materials are within the contemplated scope of disclosure. The doped semiconductor material as the gate electrode material may include dopants at a dopant concentration in a range from $1.0\times10^{19}/cm^3$ to $2.0\times10^{21}/cm^3$, although lesser and greater dopant concentrations may also be used. The dopant may be p-type or n-type. Metallic materials that may be used as the gate electrode material include conductive metallic nitride materials (such as TiN, TaN, and WN), elemental metals (such as W, Ta, Ru, Co, or Mo), and intermetallic alloy of at least two metals. Other suitable materials are within the contemplated scope of disclosure. A gate electrode material layer may be formed over the metal oxide semiconductor channel layer 30 and the first gate dielectric layer 40. The thickness of the gate electrode material layer may be in a range from 50 nm to 300 nm, although lesser and greater thicknesses may also be used.

The gate electrode material, the first gate dielectric layer 40, and the metal oxide semiconductor channel layer 30 may be patterned, for example, by applying and patterning a photoresist layer over the gate electrode material layer to cover areas that extend over a respective pair of a source region 12 and a drain region 14. Each patterned portion of the photoresist layer may be a discrete photoresist material portion. In one embodiment, the photoresist layer may be patterned such that each source region 12 and each drain region 14 has a respective area covered by a patterned photoresist material portion and a respective area that is not covered by any photoresist material portion.

An anisotropic etch process may be performed to transfer the pattern in the photoresist material portions through the layer stack including the gate electrode material layer, the first gate dielectric layer 40, and the metal oxide semiconductor channel layer 30. Each patterned portion of the gate electrode material layer comprises a first gate electrode 50. Each vertical stack of a metal oxide semiconductor channel layer 30, a first gate dielectric layer 40, and a first gate electrode 50 may overlie a portion of a source region 12 and a portion of a drain region 14. A portion of a top surface of each source region 12 may be physically exposed, and a portion of a top surface of each drain region 14 may be physically exposed.

Physically exposed sidewalls of each vertical stack of a metal oxide semiconductor channel layer 30, a first gate dielectric layer 40, and a first gate electrode 50 may be vertically coincident to one another. A sidewall of each first gate dielectric layer 40 may contact a sidewall of an overlying first gate electrode 50 over the area of a drain region 14. Each first gate electrode 50 may contact a top surface of an underlying metal oxide semiconductor channel layer 30 within the area of a distal portion of the drain region 14.

Figure 5B:
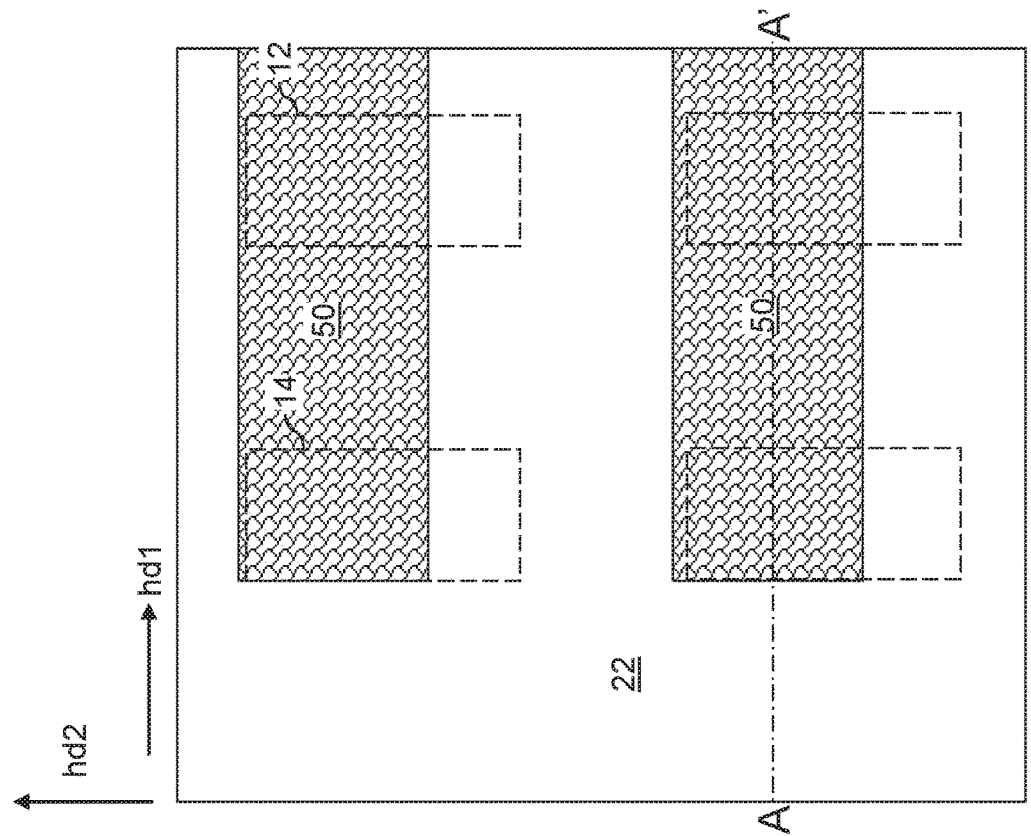
FIG. 5B is a top-down view of the exemplary structure of FIG. 5A. The vertical plane A-A' is the plane of the vertical cross-section of FIG. 5A.
Figure 5A:
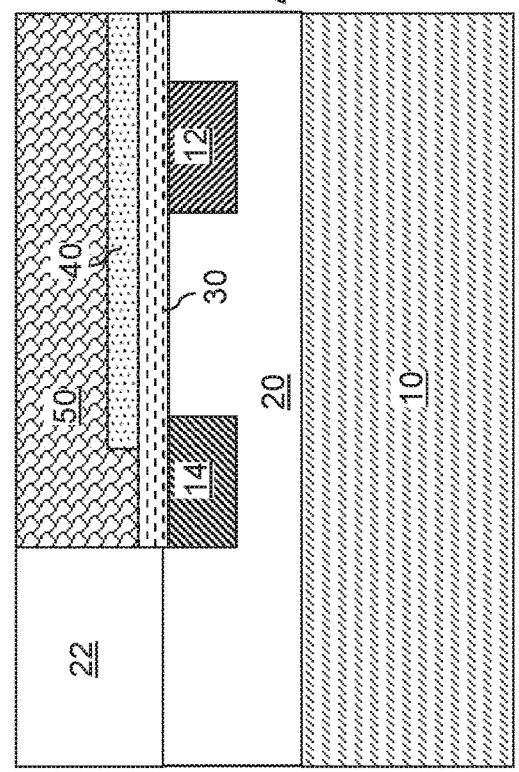
FIG. 5A is a vertical cross-sectional view of the exemplary structure after formation of a dielectric material layer according to an embodiment of the present disclosure.

FIG. 5A is a vertical cross-sectional view of the exemplary structure after formation of a dielectric material layer according to an embodiment of the present disclosure. FIG. 5B is a top-down view of the exemplary structure of FIG. 5A. The vertical plane A-A' is the plane of the vertical cross-section of FIG. 5A. Referring to FIGS. 5A and 5B, a dielectric material layer 22 may be deposited over the insulating matrix layer 20 and over the vertical stacks of a metal oxide semiconductor channel layer 30, a first gate dielectric layer 40, and a first gate electrode 50. The dielectric material layer 22 may include a planarizable dielectric material (such as undoped silicate glass or a doped silicate glass) or a self-planarizing dielectric material (such as spin-on glass). The top surface of the dielectric material layer 22 may be a horizontal surface, and may be formed within the horizontal plane including the top surfaces of the first gate electrodes 50 or may be formed above the horizontal plane including the top surfaces of the first gate electrodes 50. In one embodiment, the first gate electrodes 50 may be used as a stopping structure during a planarization process (such as a chemical mechanical planarization process), and the top surface of the dielectric material layer 22 may be formed within the horizontal plane including the top surfaces of the first gate electrodes 50. The dielectric material layer 22 is also referred to as a planarization dielectric layer.

Figure 6B:
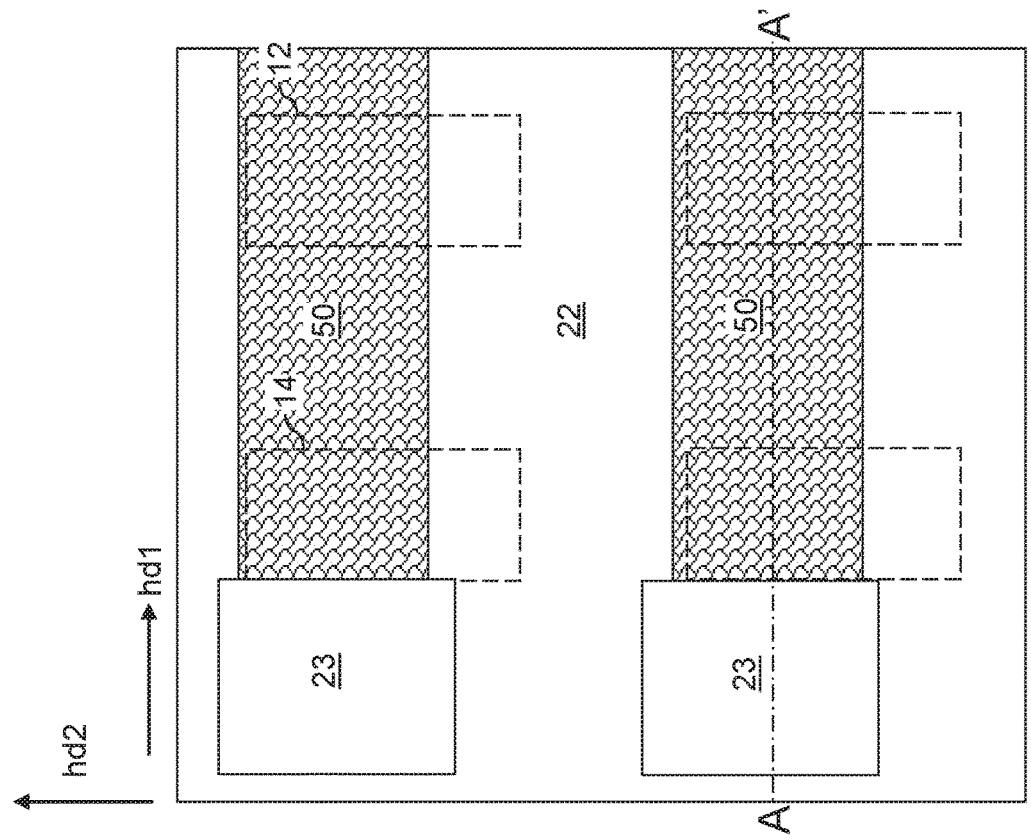
FIG. 6B is a top-down view of the exemplary structure of FIG. 6A. The vertical plane A-A' is the plane of the vertical cross-section of FIG. 6A.
Figure 6A:
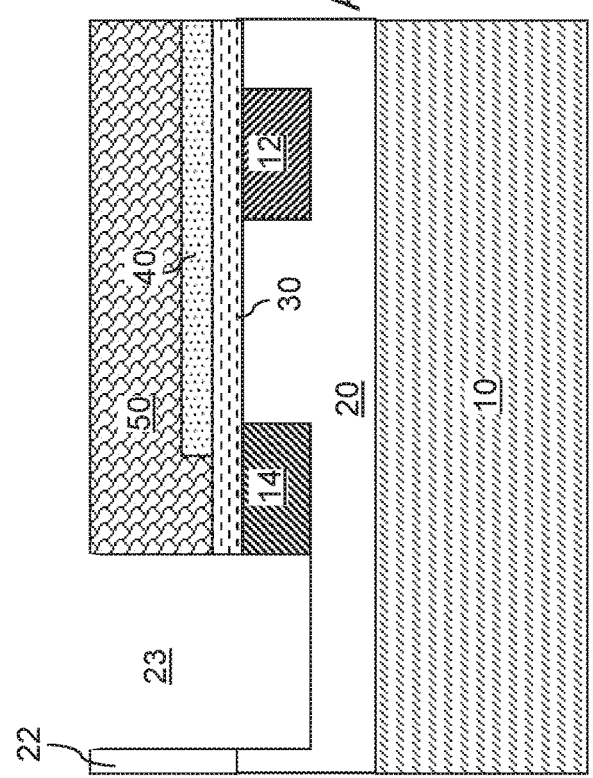
FIG. 6A is a vertical cross-sectional view of the exemplary structure after formation of via cavities according to an embodiment of the present disclosure.

FIG. 6A is a vertical cross-sectional view of the exemplary structure after formation of via cavities according to an embodiment of the present disclosure. FIG. 6B is a top-down view of the exemplary structure of FIG. 6A. The vertical plane A-A' is the plane of the vertical cross-section of FIG. 6A. Referring to FIGS. 6A and 6B, a photoresist layer (not shown) may be applied over the dielectric material layer 22, and may be lithographically patterned to form openings such that an edge of each opening in the photoresist layer overlies a peripheral portion of a respective drain region 14 that is distal from a respective source region 12. For example, a first gate electrode 50 may laterally extend along the first horizontal direction hd1, and may overlie a pair of a source region 12 and a drain region 14 that are laterally spaced apart along the first horizontal direction hd1. The area of an opening through the patterned photoresist layer may overlap with an peripheral portion of the area of the drain region 14 that is most distal from the source region 12.

An anisotropic etch process may be performed to etch through portions of the dielectric material layer 22 and optionally unmasked portions of the vertical stacks of a metal oxide semiconductor channel layer 30, a first gate dielectric layer 40, and a first gate electrode 50. A via cavity 23 may be formed within volumes from which the materials of the dielectric material layer 22, the metal oxide semiconductor channel layers 30, the first gate dielectric layers 40, and the first gate electrodes 50 are etched. Generally, the via cavities 23 may be formed through the dielectric material layer 22, and sidewalls of the metal oxide semiconductor channel layers 30, sidewalls of the first gate electrodes 50, and sidewalls of the drain regions 14 are physically exposed to the via cavities 23. Specifically, a sidewall of a drain region 14, a sidewall of a metal oxide semiconductor channel layer 30, and a sidewall of a first gate electrode 50 may be physically exposed around each via cavity 23. The lateral dimension of each via cavity 23 along the first horizontal direction hd1 may be in a range from 30 nm to 600 nm, such as from 60 nm to 300 nm, although lesser and greater lateral dimensions may also be used. The lateral dimension of each via cavity 23 along the second horizontal direction hd2 may be in a range from 30 nm to 600 nm, such as from 60 nm to 300 nm, although lesser and greater lateral dimensions may also be used. Each via cavity 23 may have a rectangular horizontal cross-sectional shape, a circular horizontal cross-sectional shape, an oval horizontal cross-sectional shape, or a horizontal cross-sectional shape of any closed non-intersecting two-dimensional horizontal cross-sectional curvilinear shape.

FIG. 7A is a vertical cross-sectional view of the exemplary structure after formation of a second gate dielectric layer and a second gate electrode in each via cavity according to an embodiment of the present disclosure. FIG. 7B is a top-down view of the exemplary structure of FIG. 7A. The vertical plane A-A' is the plane of the vertical cross-section of FIG. 7A. Referring to FIGS. 7A and 7B, a gate dielectric material layer and a conductive fill material layer may be sequentially deposited in the via cavities 23 and over the dielectric material layer 22 to form a second gate dielectric layer 60. The gate dielectric material layer deposited at this processing step is also referred to as a vertical gate dielectric layer (which is subsequently used to provide a gate dielectric layer that extends vertically). The gate dielectric material layer may include any material that may be used for the first gate dielectric layer 40. For example, the gate dielectric material layer may include a gate dielectric material such as silicon oxide, silicon oxynitride, a dielectric metal oxide, or a combination thereof. Other suitable materials are within the contemplated scope of disclosure. The thickness of the gate dielectric material layer may be in a range from 1 nm to 12 nm, such as from 2 nm to 6 nm, although lesser and greater thicknesses may also be used. The gate dielectric material layer may be deposited by a conformal deposition process such as a low pressure chemical vapor deposition (LPCVD) process or an atomic layer deposition (ALD) process. In one embodiment, the gate dielectric material layer may be deposited on a sidewall of each drain region 14, on a sidewall of each metal oxide semiconductor channel layer 30, and on a sidewall of each first gate electrode 50. The gate dielectric material layer does not contact any of the first gate dielectric layers 40.

The conductive fill material layer includes a conductive fill material, which may be any of the materials that may be used for the gate electrode material, i.e., the material of the first gate electrodes 50. For example, the conductive fill material may include a doped semiconductor material or a metallic material. The thickness of the conductive fill material layer is selected such that the entire volume of each via cavity 23 may be filled with the combination of the second gate dielectric layer 60 and the conductive fill material layer.

Excess portions of the gate dielectric material layer and the conductive fill material that overlie a horizontal top surface of the dielectric material layer 22 may be removed by a planarization process. The planarization process may use a chemical mechanical planarization (CMP) process and/or a recess etch process. The gate dielectric material layer may be divided into multiple discrete portions, each of which is herein referred to as a second gate dielectric layer 60. In other words, each remaining portion of the gate dielectric material layer comprises a second gate dielectric layer 60. Each remaining portion of the conductive fill material layer comprises a second gate electrode 70.

Generally, a second gate dielectric layer 60 and a second gate electrode 70 may be formed in each via cavity 23. Each second gate dielectric layer 60 may be formed on a sidewall of a drain region 14, on a sidewall of a metal oxide semiconductor channel layer 30, and on a sidewall of a first gate electrode 50. Each second gate electrode 70 may be formed on sidewalls of a respective second gate dielectric layer 60, and may be formed within the respective second gate dielectric layer 60. Each second gate electrode 70 may be laterally surrounded by the respective second gate dielectric layer 60, and may contact a top surface of a horizontal bottom portion of the respective second gate dielectric layer 60.

Figures 8A, 8B:
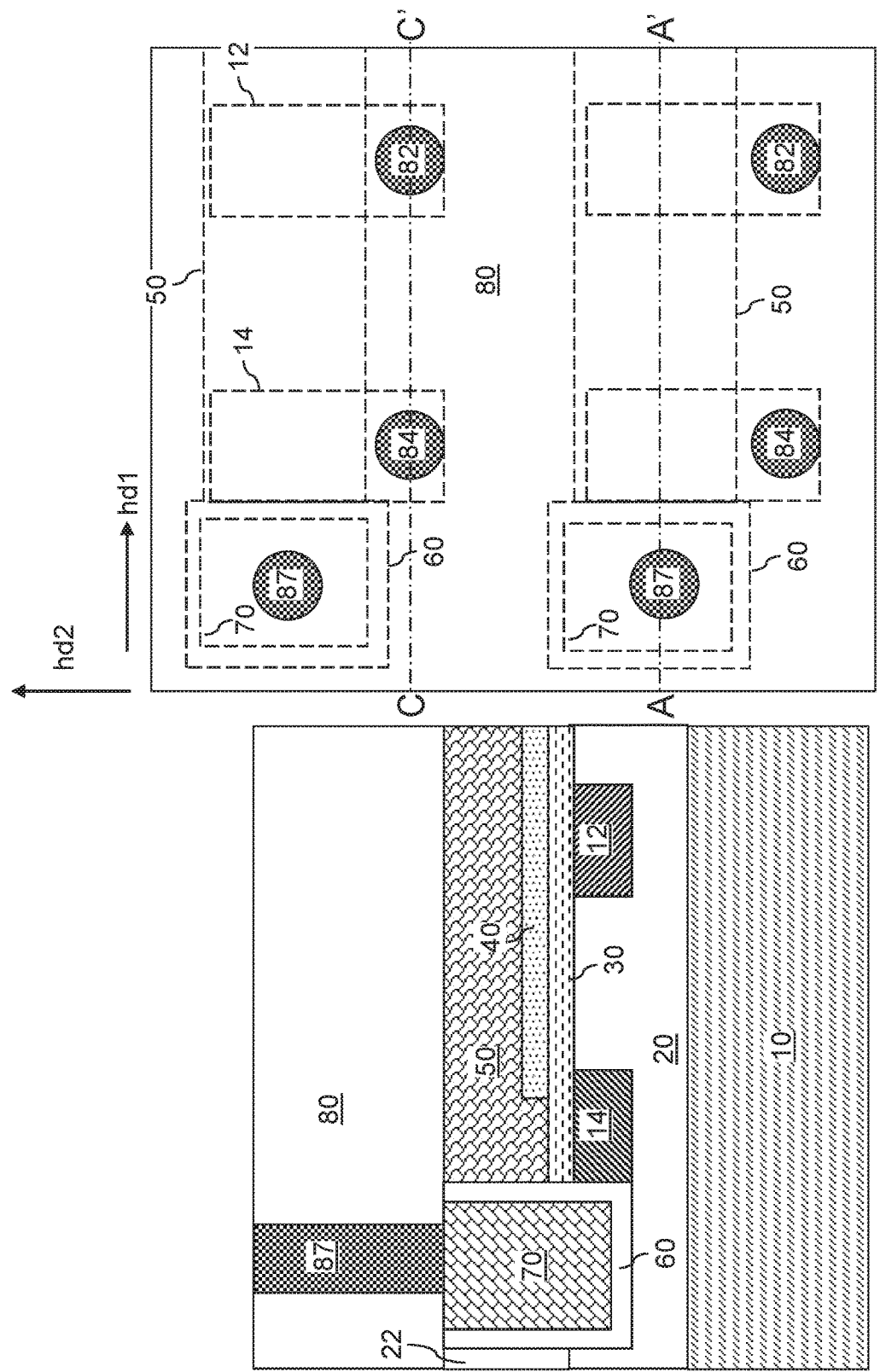
FIG. 8A is a vertical cross-sectional view of the exemplary structure after formation of a contact-level dielectric layer and contact via structures according to an embodiment of the present disclosure.
FIG. 8B is a top-down view of the exemplary structure of FIG. 8A. The vertical plane A-A' is the plane of the vertical cross-section of FIG. 8A.
Figure 8C:
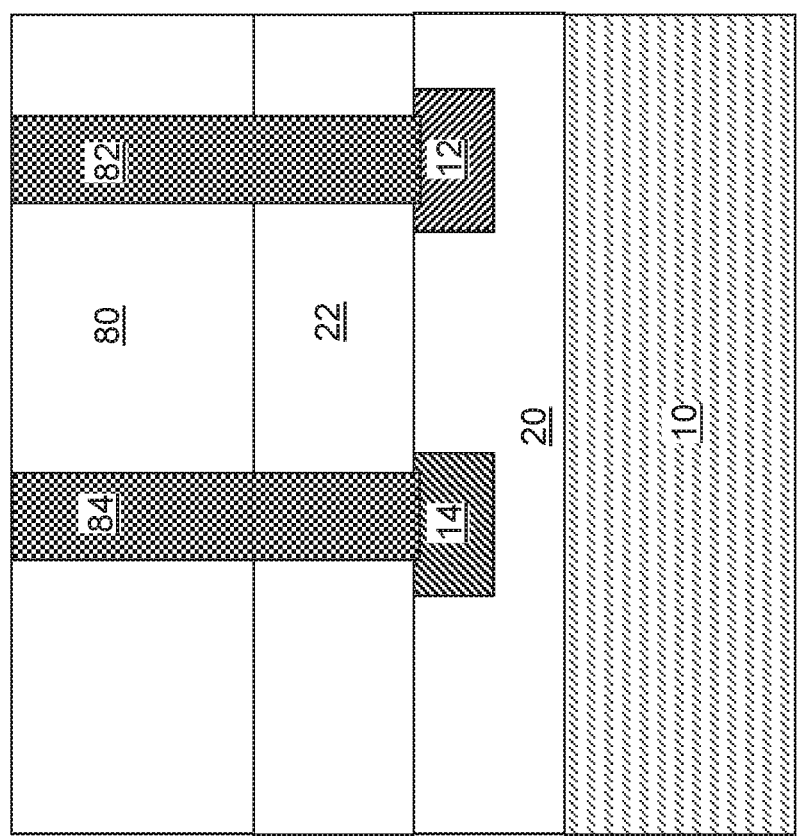
FIG. 8C is a vertical cross-sectional view the exemplary structure along the vertical plane C-C' of FIG. 8B.

FIG. 8A is a vertical cross-sectional view of the exemplary structure after formation of a contact-level dielectric layer and contact via structures according to an embodiment of the present disclosure. FIG. 8B is a top-down view of the exemplary structure of FIG. 8A. The vertical plane A-A' is the plane of the vertical cross-section of FIG. 8A. FIG. 8C is a vertical cross-sectional view the exemplary structure along the vertical plane C-C' of FIG. 8B. Referring to FIGS. 8A-8C, a contact-level dielectric layer 80 may be formed over the first gate electrodes 50, the second gate electrodes 70, and the dielectric material layer 22. The contact-level dielectric layer 80 may include a dielectric material such as silicon oxide, organosilicate glass, and/or a porous dielectric material, and may optionally include at least one dielectric liner (not shown) such as a silicon nitride liner, a silicon oxide liner, and/or a dielectric metal oxide liner. Other suitable materials are within the contemplated scope of disclosure. The contact-level dielectric layer 80 may have a thickness in a range from 100 nm to 600 nm, although lesser and greater thicknesses may also be used. The contact-level dielectric layer 80 may be formed by a conformal or non-conformal deposition process.

Via openings may be formed through the contact-level dielectric layer 80, for example, by applying and patterning a photoresist layer (not shown) over the contact-level dielectric layer 80 and by transferring the pattern in the photoresist layer through the contact-level dielectric layer 80 by performing an anisotropic etch process. Specifically, the photoresist layer may be patterned with discrete opening. Each discrete opening in the photoresist layer may overlap with, and may be located entirely within, an area of a second gate electrode 70, an area of a portion of a source region 12 that does not underlie any first gate electrode 50, or an area of a portion of a drain region 14 that does not underlie any first gate electrode 50. A top surface of a second gate electrode 70, a top surface of a source region 12, or a top surface of a drain region 14 is physically exposed at the bottom of each via opening. The photoresist layer is subsequently removed, for example, by ashing.

At least one conductive material may be deposited in the via openings, and excess portions of the at least one conductive material may be removed from above the horizontal plane including the top surface of the contact-level dielectric layer 80 by a planarization process (such as a chemical mechanical planarization process). The at least one conductive material may include a conductive metallic liner including a conductive metallic nitride (such as TiN, TaN, or WN) and a metallic fill material including an elemental metal (such as W, Co, Ru, or Mo) or an intermetallic alloy. Other suitable materials are within the contemplated scope of disclosure. Each remaining portion of the at least one conductive material filling the via openings comprise a contact via structure (82, 84, 87). The contact via structures (82, 84, 87) include source contact via structures 82 that contact a top surface of a respective source region 12, drain contact via structures 84 that contact a top surface of a respective drain region 14, and gate contact via structures 87 that contact a top surface of a respective second gate electrode 70. The first gate electrodes 50 are not contacted by any contact via structure or by any conductive structure. Thus, the first gate electrodes 50 are electrically floating under normal conditions. Specifically, the first gate electrodes 50 are electrically floating unless electrical bias voltages are applied to a respective second gate electrodes 70 and a respective drain region 14 to activate a surface portion of a metal oxide semiconductor channel layer 30 as a conductive channel.

Referring collectively to FIGS. 1A-8C and according to various embodiments of the present disclosure, a semiconductor device is provided. The semiconductor device includes a dual channel transistor device. The semiconductor device comprises: a source region 12 and a drain region 14 laterally spaced from each other and overlying a substrate 10; a metal oxide semiconductor channel layer 30 overlying, and contacting, the source region 12 and the drain region 14; a first gate dielectric layer 40 overlying a portion of the metal oxide semiconductor channel layer 30; a first gate electrode 50 overlying the first gate dielectric layer 40 and contacting a portion of the metal oxide semiconductor channel layer 30; a second gate dielectric layer 60 contacting a sidewall of the metal oxide semiconductor channel layer 30; and a second gate electrode 70 contacting a sidewall of the second gate dielectric layer 60 and spaced from the metal oxide semiconductor channel layer 30 by the second gate dielectric layer 60.

In one embodiment, the second gate dielectric layer 60 contacts a sidewall of the drain region 14. In one embodiment, the second gate dielectric layer 60 contacts a sidewall of the first gate electrode 50. In one embodiment, the sidewall of the metal oxide semiconductor channel layer 30 that contacts the second gate dielectric layer 60, the sidewall of the drain region 14 that contacts the second gate dielectric layer 60, and the sidewall of the first gate electrode 50 that contacts the second gate dielectric layer 60 are vertically coincident to one another, i.e., are located within a common vertical plane.

In one embodiment, the portion of the metal oxide semiconductor channel layer 30 in contact with the first gate electrode 50 overlies an area of the drain region 14, and is located outside an entire area of the source region 12 in a plan view. The plan view refers to a view along the vertical direction, i.e., a view along a direction perpendicular to an interface between the source region 12 and the metal oxide semiconductor channel layer 30.

In one embodiment, semiconductor device comprises a insulating matrix layer 20 contacting the source region 12, the drain region 14, and the metal oxide semiconductor channel layer 30, and vertically spaced from the first gate dielectric layer 40. In one embodiment, the portion of the metal oxide semiconductor channel layer 30 in contact with the first gate electrode 50 is located outside an entire area of the first gate dielectric 40 in the plan view.

In one embodiment, a first sidewall of the first gate dielectric layer 40 and a first sidewall of the first gate electrode 50 laterally extend along a first horizontal direction hd1 and are vertically coincident with each other, and may overlie the source region 12 and the drain region 14. A second sidewall of the first gate electrode 50 may laterally extends along a second horizontal direction hd2, and may be vertically coincident with the sidewall of the metal oxide semiconductor channel layer 30 that contacts the second gate dielectric layer 60. In one embodiment, the first gate electrode 50 is electrically floating, and is not in direct contact with any conductive material.

In one embodiment, the semiconductor device may comprise: a dielectric material layer 22 laterally surrounding the first gate dielectric layer 40 and the first gate electrode 50; a source contact via structure 82 formed within the dielectric material layer 22, contacting the source region 12, and laterally spaced from the first gate dielectric layer 40; and a drain contact via structure 84 formed within the dielectric material layer 22, contacting the drain region 14, and laterally spaced from the first gate dielectric layer 40.

Figure 9A:
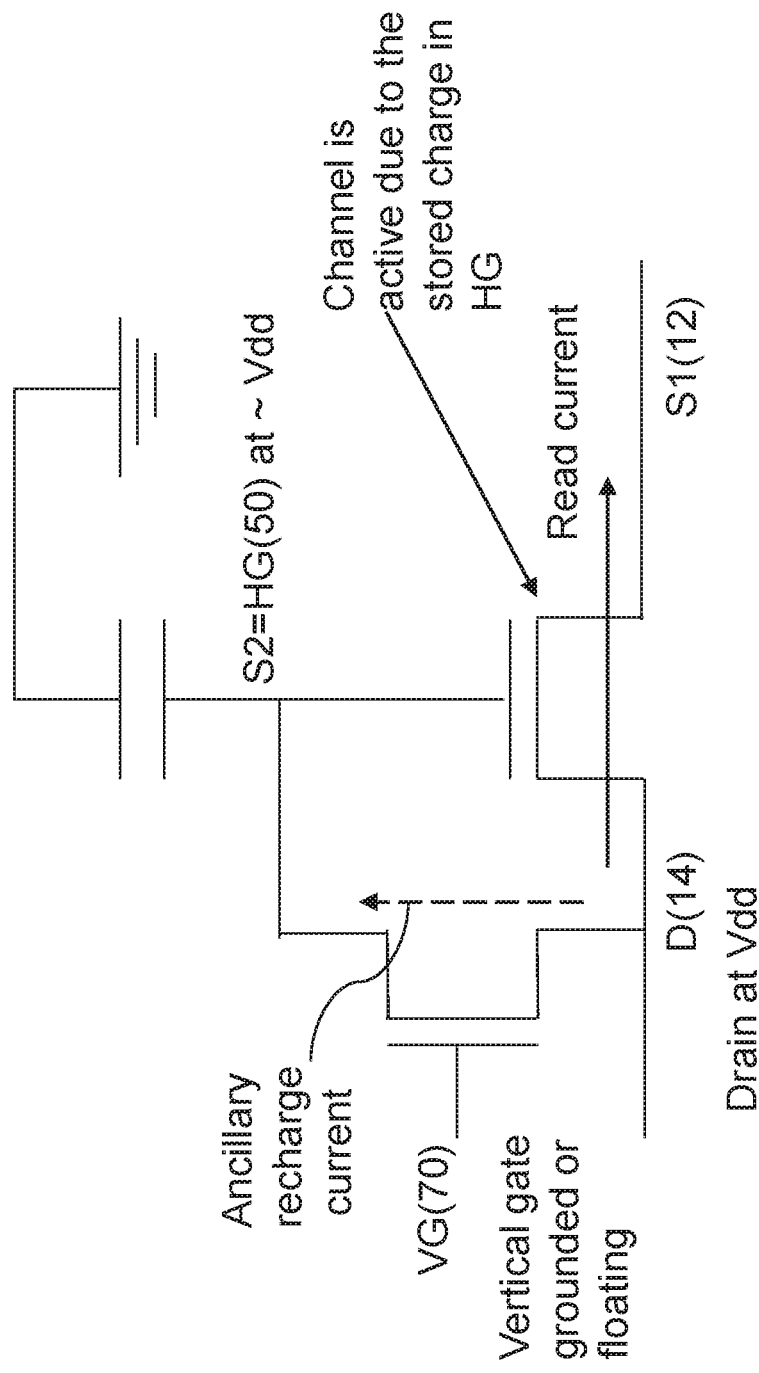
FIG. 9A schematically illustrates the configuration of a dual channel transistor device of the present disclosure during a read operation in embodiments in which electrical charges are stored in the first gate electrode according to an embodiment of the present disclosure.

Referring to FIG. 9A, the dual channel transistor device of the present disclosure is schematically illustrated during a read operation in embodiments in which electrical charges are stored in the first gate electrode 50, i.e., a state of "1" is encoded in the first gate electrode 50. A source region 12 of the exemplary structure in FIGS. 8A-8C is represented as a first source region 51 for a horizontal channel transistor. A drain region 14 of the exemplary structure in FIGS. 8A-8C is represented as a common drain region D for the horizontal channel transistor and for the vertical channel transistor. A first gate electrode 50 of the exemplary structure in FIGS. 8A-8C is represented as a horizontal gate (HG) of the horizontal channel transistor. The first gate electrode 50 of the exemplary structure in FIGS. 8A-8C also functions as a second source region S2 of the vertical channel transistor. A second gate electrode 70 of the exemplary structure in FIGS. 8A-8C is represented as a vertical gate (VG) of the vertical channel transistor. The first gate electrode 50 of the exemplary structure in FIGS. 8A-8C is electrically floating unless the vertical channel of the vertical channel transistor is activated, and functions as a first node of a capacitor. Electrical ground of electrically grounded components (such as the source region 12) functions as a second node of the capacitor.

The horizontal channel transistor includes the source region 12 as a source region, the drain region 14 as a drain region, a horizontally extending portion of the metal oxide semiconductor channel layer 30 as a semiconductor channel, the first gate electrode 50 as a gate electrode, and the first gate dielectric layer 40 as a gate dielectric. The vertical channel transistor includes the first gate electrode 50 as a source region, the drain region 14 as a drain region, a surface portion of the metal oxide semiconductor channel layer 30 adjacent to a vertical interface between the second gate dielectric layer 60 as a semiconductor channel, the second gate electrode 70 as a gate electrode, and the second gate dielectric layer 60 as a gate dielectric.

During a read operation, the electrical state of the first gate electrode 50 can be determined (by measuring the quantity of electrical charges in the first gate electrode 50) by electrically grounding the source region 12, by applying a read voltage (such as a power supply voltage Vdd) to the drain region 14, and by measuring electrical current that flows between the drain region 14 and the source region 12. In a state in which the first gate electrode 50 is charged (i.e., stores electrical charges after a programming operation that programs "1," i.e., is in a state in which electrical charges are present in the first gate electrode 50), the electrical charges in the first gate electrode 50 activates the horizontal semiconductor channel within the metal oxide semiconductor channel layer 30. The horizontal semiconductor channel in the metal oxide semiconductor channel layer 30 becomes conductive, and a read current flows between the drain region 14 and the source region 12. The non-zero read current may be detected by a sense amplifier, and the state of "1" may be measured and determined by the sense amplifier. The vertical gate electrode (i.e., the second gate electrode 70) may be electrically floating, or may be grounded during the read operation. Ancillary recharge current may flow through an edge portion of the metal oxide semiconductor channel layer 30 that are proximal to the second gate electrode 70 because the horizontal semiconductor channel is active. Thus, the read operation may recharge the "1" state and compensate for any gradual loss in the stored electrical charges in the first gate electrode 50.

Referring to FIG. 9B, the dual channel transistor device of the present disclosure is schematically illustrated during a read operation in a state in which electrical charges are not stored in the first gate electrode 50, i.e., a state of "0" is encoded in the first gate electrode 50. In a state in which the first gate electrode 50 is discharged (i.e., does not store electrical charges after a programming operation that programs "0," i.e., is in a state in which electrical charges are absent in the first gate electrode 50), the horizontal semiconductor channel within the metal oxide semiconductor channel layer 30 is not activated during a read operation because electrical charges are absent in the first gate electrode 50. The horizontal semiconductor channel in the metal oxide semiconductor channel layer 30 remains insulating, and no read current flows between the drain region 14 and the source region 12. The zero read current may be detected by a sense amplifier, and the state of "0" may be measured and determined by the sense amplifier. The vertical gate electrode (i.e., the second gate electrode 70) may be electrically floating, or may be grounded during the read operation. Ancillary recharge current does not flow through the metal oxide semiconductor channel layer 30 because the metal oxide semiconductor channel layer 30 remains non-conductive. Thus, the read operation does not add any electrical charge to the first gate electrode 50.

Figure 10A:
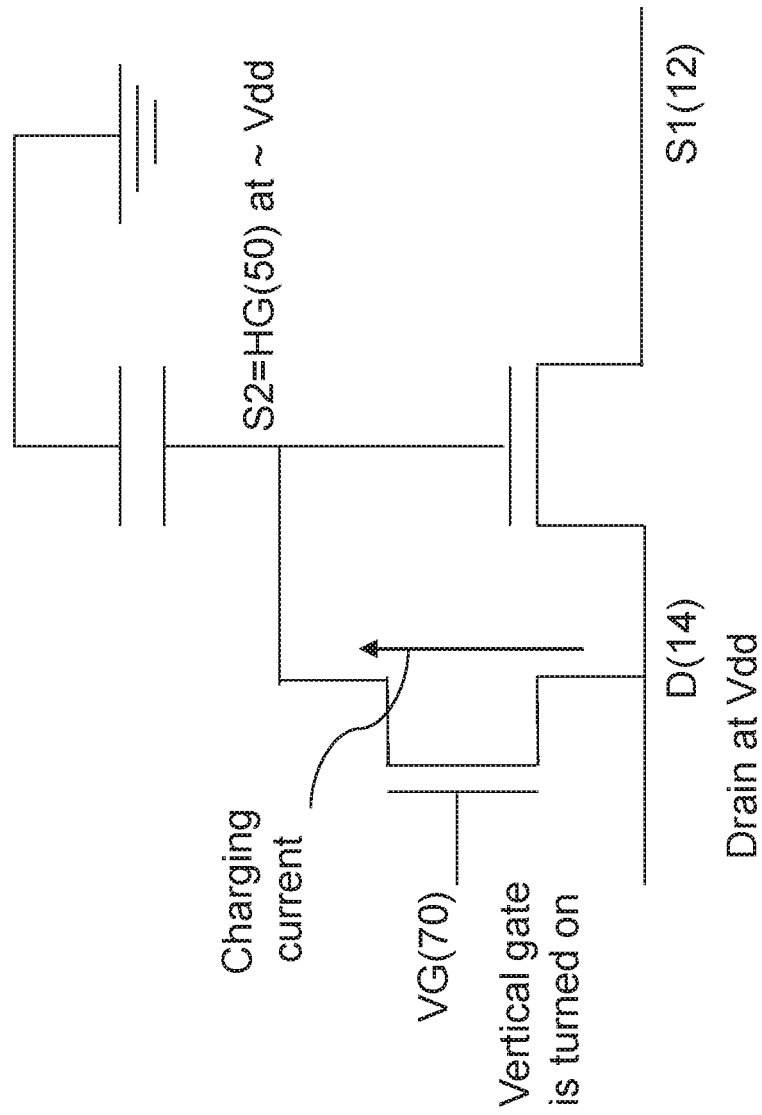
FIG. 10A schematically illustrates the configuration of an dual channel transistor device of the present disclosure during a write operation for writing "1" according to an embodiment of the present disclosure.

Referring to FIG. 10A, the dual channel transistor device of the present disclosure is schematically illustrated during a write (programming) operation for writing "1" according to an embodiment of the present disclosure. The first gate electrode 50 may be programmed into a charged state, i.e., a "1" state, by applying a non-zero programming voltage (such as a power supply voltage Vdd) to the drain region 14 and by applying a turn-on voltage to the second gate electrode 70 that activates a surface semiconductor channel in a surface portion of the metal oxide semiconductor channel layer 30. The surface semiconductor channel may be formed in proximity to an interface between the second gate dielectric layer 60 and the metal oxide semiconductor channel layer 30. Charging current flows through the surface semiconductor channel into the first gate electrode 50. The source region 12 may be electrically floating or may be electrically grounded during the programming operation.

Figure 10B:
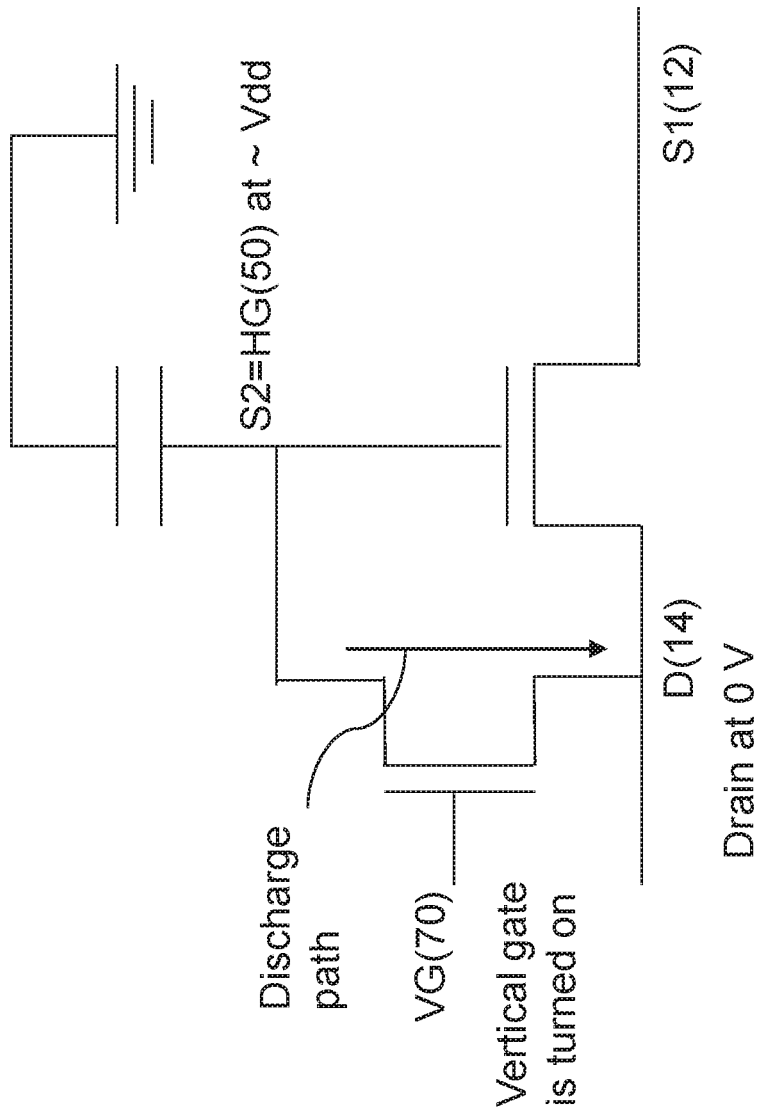
FIG. 10B schematically illustrates the configuration of the dual channel transistor device of the present disclosure during a write operation for writing "0" according to an embodiment of the present disclosure.

Referring to FIG. 10B, the dual channel transistor device of the present disclosure is schematically illustrated during a write (programming) operation for writing "0" according to an embodiment of the present disclosure. The first gate electrode 50 may be programmed into a non-charged state, i.e., a "0" state, by applying zero voltage to the drain region 14 and by applying a turn-on voltage to the second gate electrode 70 that activates a surface semiconductor channel in a surface portion of the metal oxide semiconductor channel layer 30. The surface semiconductor channel may be formed in proximity to an interface between the second gate dielectric layer 60 and the metal oxide semiconductor channel layer 30. Any electrical charge stored in the first gate electrode 50 may be drained through the surface semiconductor channel to the drain region 14 that is electrically grounded. The source region 12 may be electrically floating or may be electrically grounded during the programming operation.

Figure 11:
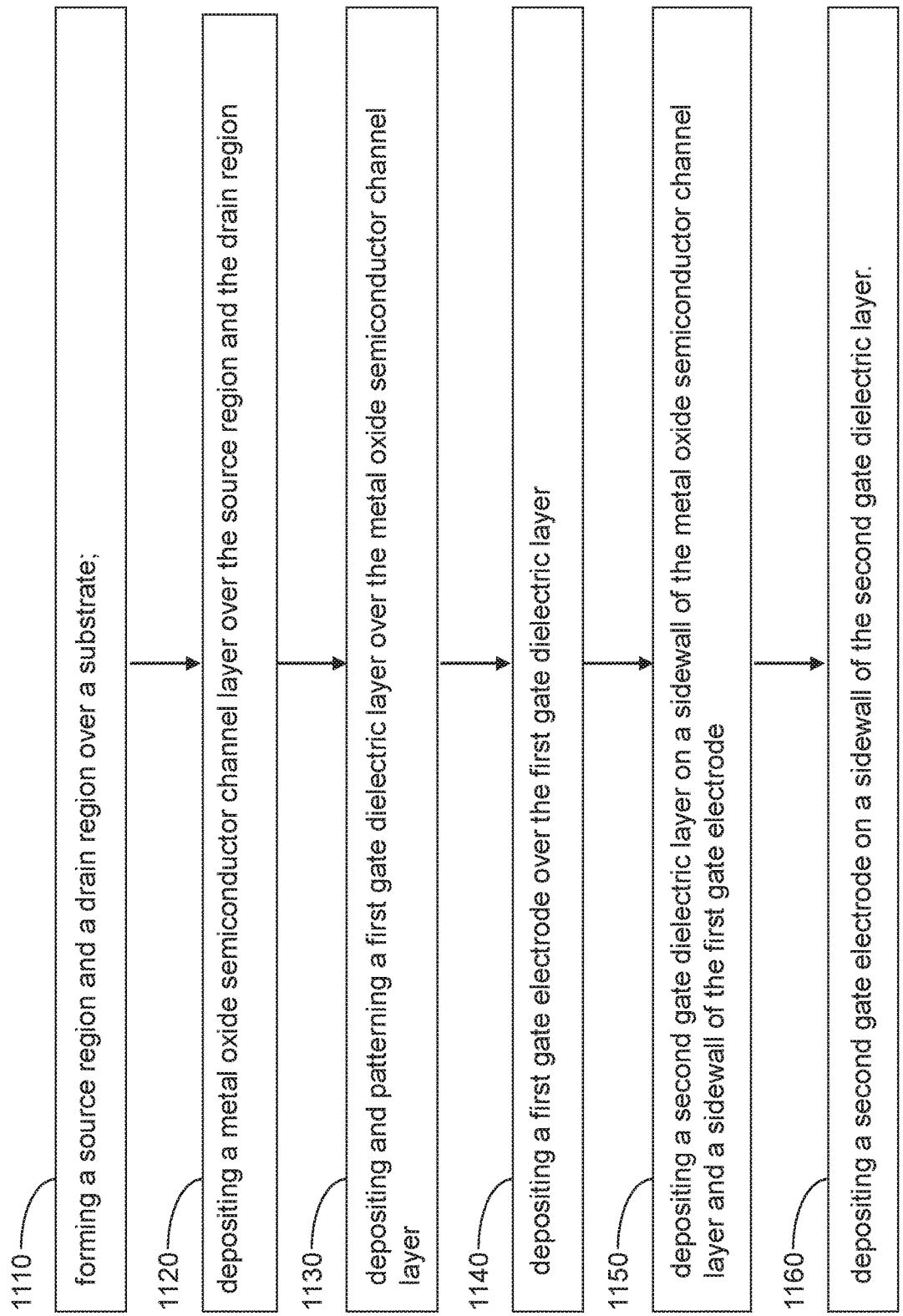
FIG. 11 is a flowchart illustrating steps for manufacture of the dual channel transistor device according to an embodiment of the present disclosure.

Referring to FIG. 11, a flowchart illustrates steps for manufacture of the dual channel transistor device according to an embodiment of the present disclosure. Referring to step 1110 and FIGS. 1A, 1B, 2A, and 2B, a source region 12 and a drain region 14 are formed over a substrate 10. Referring to step 1120 and FIGS. 3A and 3B, a metal oxide semiconductor channel layer 30 is formed over the source region 12 and the drain region 14. Referring to step 1130 and FIGS. 3A and 3B, a first gate dielectric layer 40 is deposited and patterned over the metal oxide semiconductor channel layer 30. Referring to step 1140 and FIGS. 4A and 4B, a first gate electrode 50 is formed over the first gate dielectric layer 40. Referring to step 1150 and FIGS. 5A-7B, a second gate dielectric layer 60 may be deposited on a sidewall of the metal oxide semiconductor channel layer 30 and a sidewall of the first gate electrode 50. Referring to step 1160 and FIGS. 7A and 7B, a second gate electrode 70 may be deposited on a sidewall of the second gate dielectric layer 60.

Figure 12:
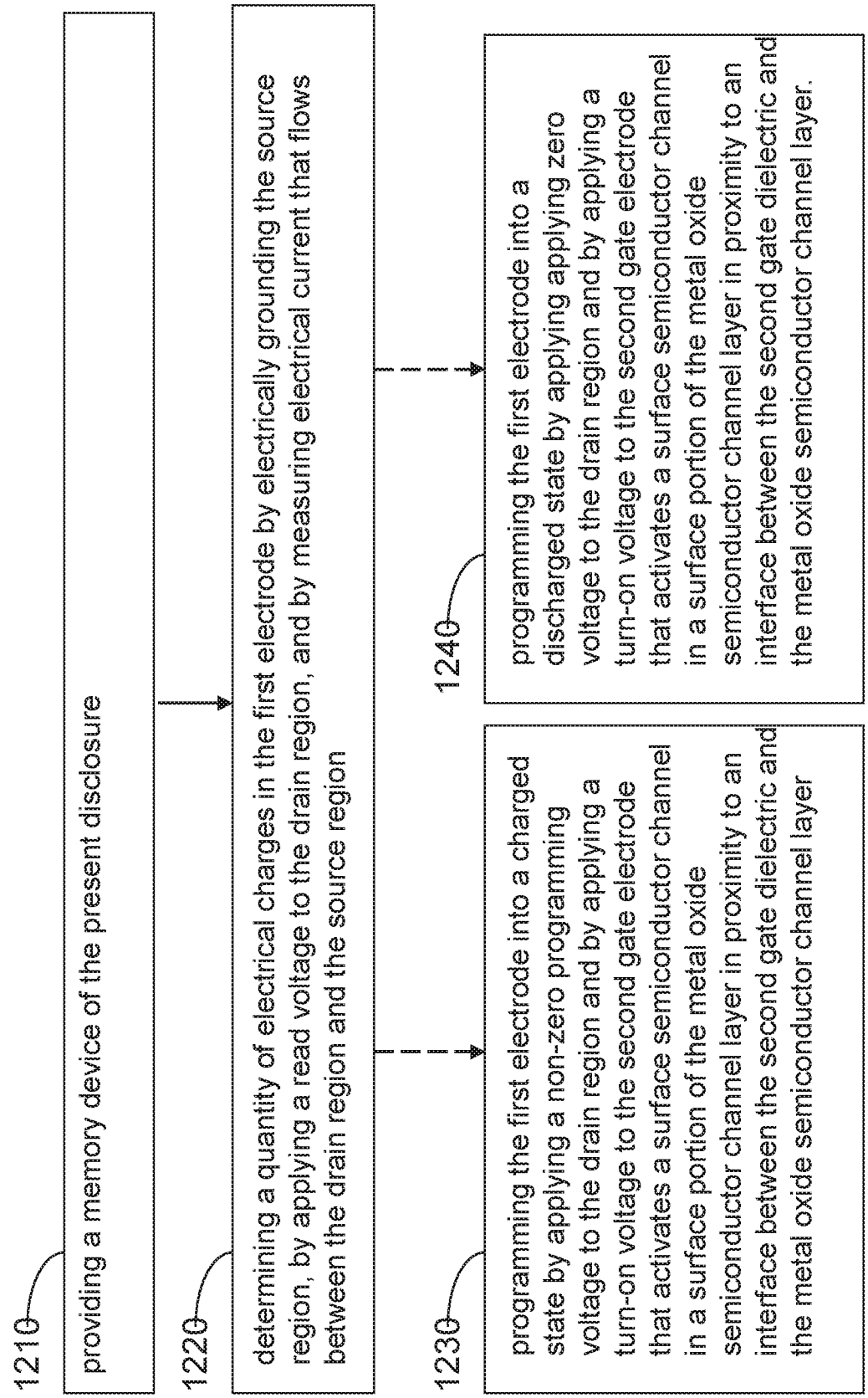
FIG. 12 is a flowchart illustrating steps for operation of the dual channel transistor device according to an embodiment of the present disclosure.

Referring to FIG. 12, a flowchart illustrates steps for operation of the dual channel transistor device according to an embodiment of the present disclosure. Referring to step 1210 and FIGS. 1A-8C, a memory device of the present disclosure may be provided. Generally, the memory device includes a metal oxide semiconductor channel layer 30 extending between a source region 12 and a drain region 14, a first gate electrode 50 having a first portion that is spaced from the metal oxide semiconductor channel layer 30 by a first gate dielectric layer 40 and having a second portion that contacts a portion of the metal oxide semiconductor channel layer 30, a second gate dielectric layer 60 contacting a sidewall of the metal oxide semiconductor channel layer 30, and a second gate electrode 70 contacting the second gate dielectric layer 60. Referring to step 1220 and FIGS. 9A and 9B, the quantity of electrical charges in the first gate electrode 50 may be measured and determined by electrically grounding the source region 12, by applying a read voltage to the drain region 14, and by measuring electrical current that flows between the drain region 14 and the source region 12. If the read current is non-zero, the first gate electrode 50 includes electrical charges, and thus, has a state of "1." If the read current is zero, the first gate electrode 50 does not include electrical charges, and thus, has a state of "0."

Optionally, programming steps may be performed. Referring to the optional step 1230 and FIG. 10A, the first gate electrode 50 may be programmed into a charged state (i.e., a "1" state) by applying a non-zero programming voltage to the drain region 14 and by applying a turn-on voltage to the second gate electrode 70 that activates a surface semiconductor channel in a surface portion of the metal oxide semiconductor channel layer 30. The surface semiconductor channel is formed in proximity to an interface between the second gate dielectric layer 60 and the metal oxide semiconductor channel layer 30. Alternatively, subsequently, and/or prior to performing step 1230, and referring to step 1240 and FIG. 10B, the first gate electrode 50 may be programmed into a discharged state (i.e., a "0" state) by applying zero voltage to the drain region 14 and by applying a turn-on voltage to the second gate electrode 70 that activates a surface semiconductor channel in a surface portion of the metal oxide semiconductor channel layer 30. Any electrical charge in the first gate electrode 50 may be drained through the surface semiconductor channel.

The various embodiments of the present disclosure may be used to manufacture and operate a dual channel memory device, or an "orthogonal channel" memory device in which a first gate electrode may be used as an electrically floating gate electrode that may be electrically connected to a drain region 14 only when a turn-on voltage is applied to a second gate electrode 70, which is the gate electrode of a vertical channel transistor within the dual channel memory device. The dual channel memory device does not use any charge tunneling, and thus, the reliability of the memory device is enhanced compared to memory devices that use a tunneling dielectric layer that suffers from charge trapping over usage. The dual channel memory device of the present disclosure may provide a small device footprint and high device reliability.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a source region and a drain region laterally spaced from each other and overlying a substrate;
   a metal oxide semiconductor channel layer overlying, and contacting, the source region and the drain region;
   a first gate dielectric layer overlying a portion of the metal oxide semiconductor channel layer;
   a first gate electrode overlying the first gate dielectric layer and contacting a portion of the metal oxide semiconductor channel layer;
   a second gate dielectric layer contacting a sidewall of the metal oxide semiconductor channel layer; and
   a second gate electrode contacting a sidewall of the second gate dielectric layer and spaced from the metal oxide semiconductor channel layer by the second gate dielectric layer.

2. The semiconductor device of claim 1, wherein the second gate dielectric layer contacts a sidewall of the drain region.

3. The semiconductor device of claim 2, wherein the second gate dielectric layer contacts a sidewall of the first gate electrode.

4. The semiconductor device of claim 3, wherein the sidewall of the metal oxide semiconductor channel layer, the sidewall of the drain region, and the sidewall of the first gate electrode are vertically coincident to one another.

5. The semiconductor device of claim 1, wherein the portion of the metal oxide semiconductor channel layer in contact with the first gate electrode overlies an area of the drain region, and is located outside an entire area of the source region in a plan view along a direction perpendicular to an interface between the source region and the metal oxide semiconductor channel layer.

6. The semiconductor device of claim 5, further comprising an insulating matrix layer contacting the source region, the drain region, and the metal oxide semiconductor channel layer, and vertically spaced from the first gate dielectric layer.

7. The semiconductor device of claim 6, wherein the portion of the metal oxide semiconductor channel layer in contact with the first gate electrode is located outside an entire area of the first gate dielectric layer in the plan view.

8. The semiconductor device of claim 1, wherein:
   a first sidewall of the first gate dielectric layer and a first sidewall of the first gate electrode laterally extend along a first horizontal direction and are vertically coincident with each other; and
   a second sidewall of the first gate electrode laterally extends along a second horizontal direction and is vertically coincident with the sidewall of the metal oxide semiconductor channel layer.

9. The semiconductor device of claim 1, wherein the first gate electrode is not in direct contact with any conductive material.

10. The semiconductor device of claim 1, further comprising:
    a dielectric material layer laterally surrounding the first gate dielectric layer and the first gate electrode;
    a source contact via structure formed within the dielectric material layer, contacting the source region, and laterally spaced from the first gate dielectric layer; and
    a drain contact via structure formed within the dielectric material layer, contacting the drain region, and laterally spaced from the first gate dielectric layer.

11. A method of forming a semiconductor device, comprising:
    forming a source region and a drain region over a substrate;
    depositing a metal oxide semiconductor channel layer over the source region and the drain region;
    depositing and patterning a first gate dielectric layer over the metal oxide semiconductor channel layer;
    depositing a first gate electrode over the first gate dielectric layer;
    depositing a second gate dielectric layer on a sidewall of the metal oxide semiconductor channel layer and a sidewall of the first gate electrode; and
    depositing a second gate electrode on a sidewall of the second gate dielectric layer.

12. The method of claim 11, wherein:
    depositing and patterning the first gate dielectric layer comprises exposing a portion of a top surface of the metal oxide semiconductor channel layer; and
    the first gate electrode is deposited on the top surface of the metal oxide semiconductor channel layer.

13. The method of claim 11, further comprising:
    depositing a dielectric material layer around the first gate dielectric layer and the first gate electrode; and
    forming a via cavity through the dielectric material layer, wherein the sidewall of the metal oxide semiconductor channel layer and the sidewall of the first gate electrode are exposed by the via cavity.

14. The method of claim 13, wherein the second gate dielectric layer and the second gate electrode are formed by:
    sequentially depositing a gate dielectric material layer and a conductive fill material layer in the via cavity and over the dielectric material layer; and
    removing portions of the gate dielectric material layer and the conductive fill material layer that overlie a horizontal top surface of the dielectric material layer, wherein a remaining portion of the gate dielectric material layer comprise the second gate dielectric layer, and a remaining portion of the conductive fill material layer comprise the second gate electrode.

15. The method of claim 13, wherein:
    a sidewall of the drain region is exposed by the via cavity after formation of the via cavity; and
    the second gate dielectric layer is formed on the sidewall of the drain region.

16. The method of claim 11, further comprising:
    forming an insulating matrix layer over the substrate;
    forming a pair of recess regions in the insulating matrix layer; and
    filling the pair of recess regions with a doped semiconductor material or a metallic material, wherein material portions filling the pair of recess regions comprise the source region and the drain region.

17. The method of claim 16, further comprising removing portions of the doped semiconductor material or the metallic material from above a horizontal plane including a top surface of the insulating matrix layer,
wherein:
    top surfaces of the source region and the drain region are coplanar with the top surface of the insulating matrix layer; and
    the metal oxide semiconductor channel layer has a uniform thickness throughout.

18. A method of operating a memory device, comprising:
    providing a memory device that includes a metal oxide semiconductor channel layer extending between a source region and a drain region, a first gate electrode having a first portion that is spaced from the metal oxide semiconductor channel layer by a first gate dielectric layer and having a second portion that contacts a portion of the metal oxide semiconductor channel layer, a second gate dielectric layer contacting a sidewall of the metal oxide semiconductor channel layer, and a second gate electrode contacting the second gate dielectric layer; and determining an electrical state of the first gate electrode by electrically grounding the source region, by applying a read voltage to the drain region, and by measuring electrical current that flows between the drain region and the source region.

19. The method of claim 18, further comprising programming the first gate electrode into a charged state by applying a non-zero programming voltage to the drain region and by applying a turn-on voltage to the second gate electrode that activates a surface semiconductor channel in a surface portion of the metal oxide semiconductor channel layer in proximity to an interface between the second gate dielectric layer and the metal oxide semiconductor channel layer.

20. The method of claim 18, further comprising programming the first gate electrode into a discharged state by applying zero voltage to the drain region and by applying a turn-on voltage to the second gate electrode that activates a surface semiconductor channel in a surface portion of the metal oxide semiconductor channel layer in proximity to an interface between the second gate dielectric layer and the metal oxide semiconductor channel layer.

* * * * *